(12) United States Patent
Li et al.

(10) Patent No.: US 10,840,447 B2
(45) Date of Patent: Nov. 17, 2020

(54) FABRICATION OF PHASE CHANGE MEMORY CELL IN INTEGRATED CIRCUIT

(71) Applicant: International Business Machines Corporation, Armonk, NY (US)

(72) Inventors: Baozhen Li, South Burlington, VT (US); Chih-Chao Yang, Glenmont, NY (US); Andrew Tae Kim, Poughkeepsie, NY (US); Barry Linder, Hastings-on-Hudson, NY (US)

(73) Assignee: INTERNATIONAL BUSINESS MACHINES CORPORATION, Armonk, NY (US)

( * ) Notice: Subject to any disclaimer, the term of this patent is extended or adjusted under 35 U.S.C. 154(b) by 0 days.

(21) Appl. No.: 16/299,313

(22) Filed: Mar. 12, 2019

(65) Prior Publication Data

US 2020/0295261 A1 Sep. 17, 2020

(51) Int. Cl.
*H01L 47/00* (2006.01)
*H01L 45/00* (2006.01)
*H01L 27/24* (2006.01)

(52) U.S. Cl.
CPC ...... *H01L 45/1675* (2013.01); *H01L 27/2463* (2013.01); *H01L 45/06* (2013.01); *H01L 45/126* (2013.01); *H01L 45/1226* (2013.01); *H01L 45/144* (2013.01)

(58) Field of Classification Search
CPC .............. H01L 45/1675; H01L 45/126; H01L 27/2463; H01L 45/06; H01L 45/1226; H01L 45/144; H01L 45/04–065; H01L 45/14–144; H01L 45/16–1691; H01L 45/145–147; G11C 11/5678; G11C 13/0004; G11C 11/5685; G11C 13/0007
See application file for complete search history.

(56) References Cited

U.S. PATENT DOCUMENTS

| | | | |
|---|---|---|---|
| 7,728,319 B2 | 6/2010 | Goux et al. |
| 8,212,233 B2 | 7/2012 | Wang et al. |
| 8,237,140 B2 | 8/2012 | Lung et al. |
| 8,665,629 B2 | 3/2014 | Park et al. |

(Continued)

OTHER PUBLICATIONS

Xiong et al., "Nanowire Phase Change Memory with Carbon Nanotube Electrodes", IEEE 70th Device Research Conference, 2012, pp. 215-216.

*Primary Examiner* — Cuong B Nguyen
(74) *Attorney, Agent, or Firm* — Cantor Colburn LLP; Alvin Borromeo

(57) ABSTRACT

A phase change memory (PCM) cell in an integrated circuit and a method of fabricating it involve depositing a layer of PCM material on a surface of a dielectric, and patterning the layer of PCM material into a plurality of PCM blocks. Heater material is formed on both sidewalls of each of the plurality of the PCM blocks to form a plurality of PCM cells. Each of the plurality of the PCM blocks and the heater material on both the sidewalls represents a PCM cell. An additional layer of the dielectric is deposited above and between the plurality of the PCM cells, and trenches are formed in the dielectric. Trenches are formed in contact with each side of each of the plurality of the PCM cells. Metal is deposited in each of the trenches. Current flow in the metal heats the heater material of one of the PCM cells.

10 Claims, 14 Drawing Sheets

(56) References Cited

U.S. PATENT DOCUMENTS

| | | |
|---|---|---|
| 8,866,116 B2 | 10/2014 | Eungyoon |
| 8,981,330 B2 | 3/2015 | Lung |
| 9,236,298 B2 | 1/2016 | Lin et al. |
| 9,929,341 B2 | 3/2018 | Masuoka et al. |
| 10,002,877 B2 | 6/2018 | Park et al. |
| 2008/0303014 A1 | 12/2008 | Goux et al. |
| 2012/0025162 A1* | 2/2012 | Shin .................. H01L 45/126 257/3 |
| 2012/0175582 A1* | 7/2012 | Yang .................. H01L 45/1608 257/2 |

* cited by examiner

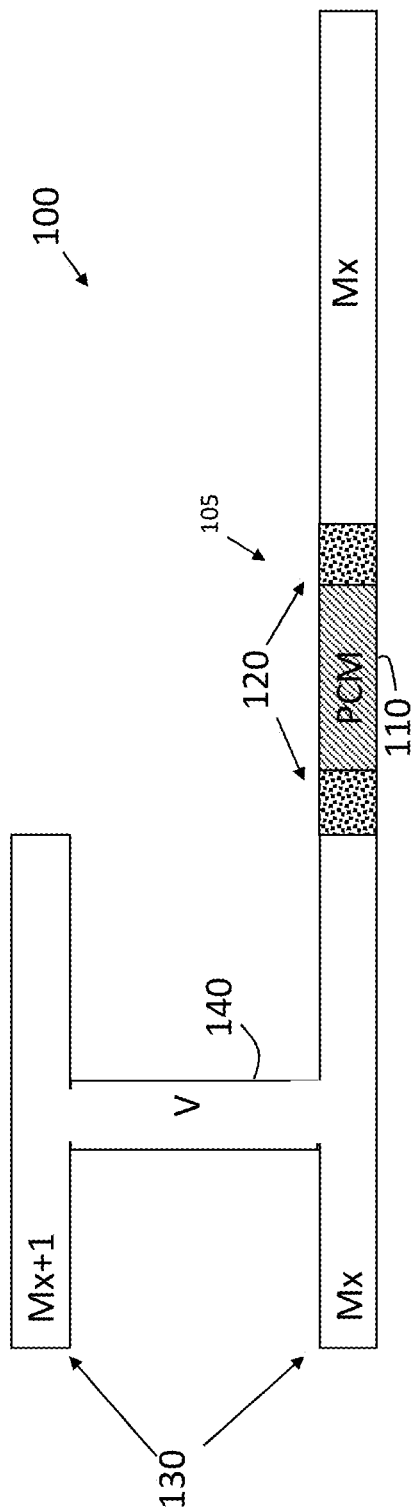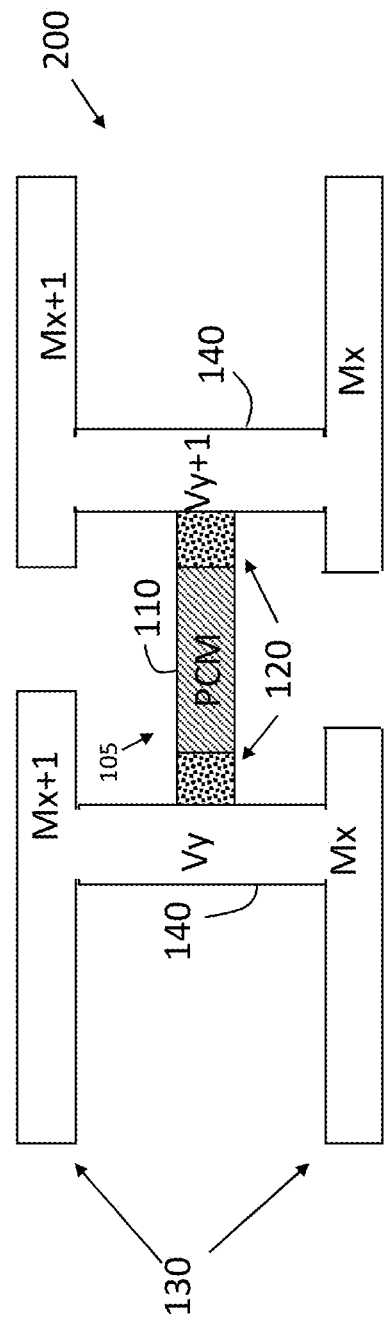
FIG. 1
FIG. 2

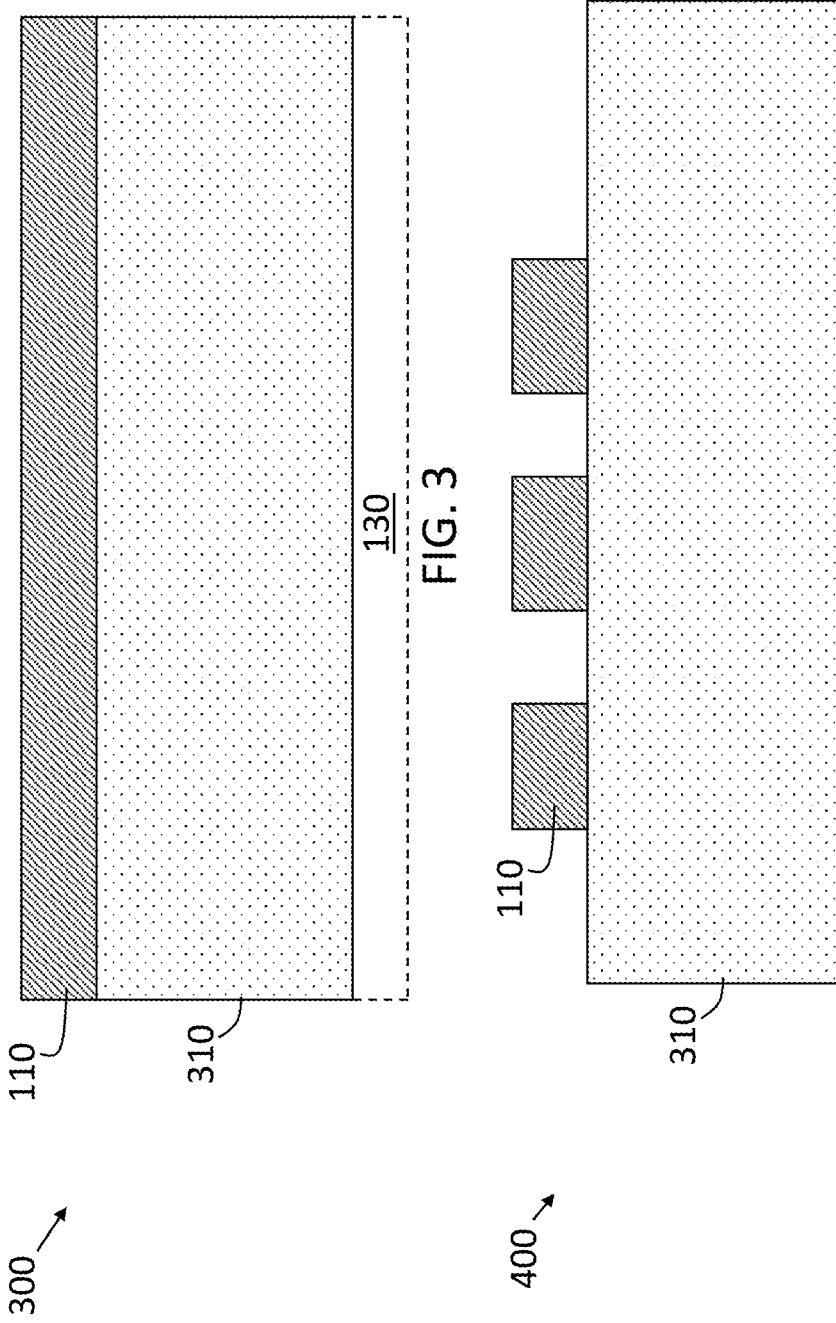

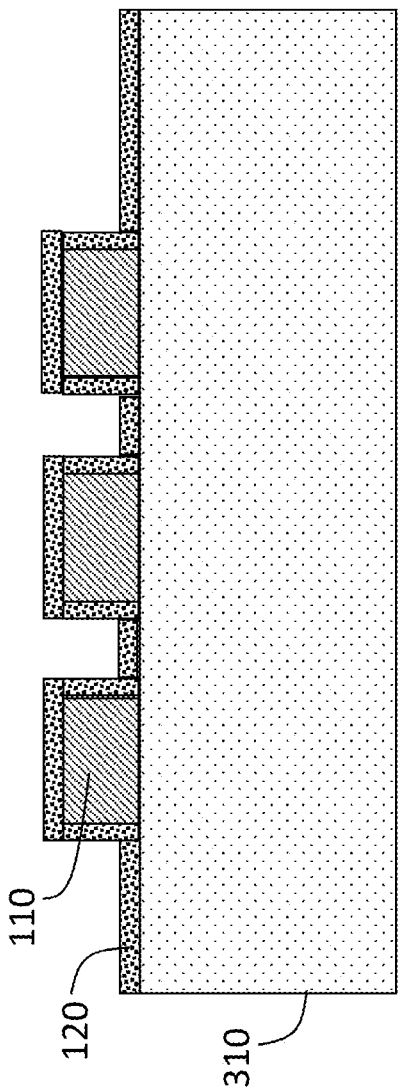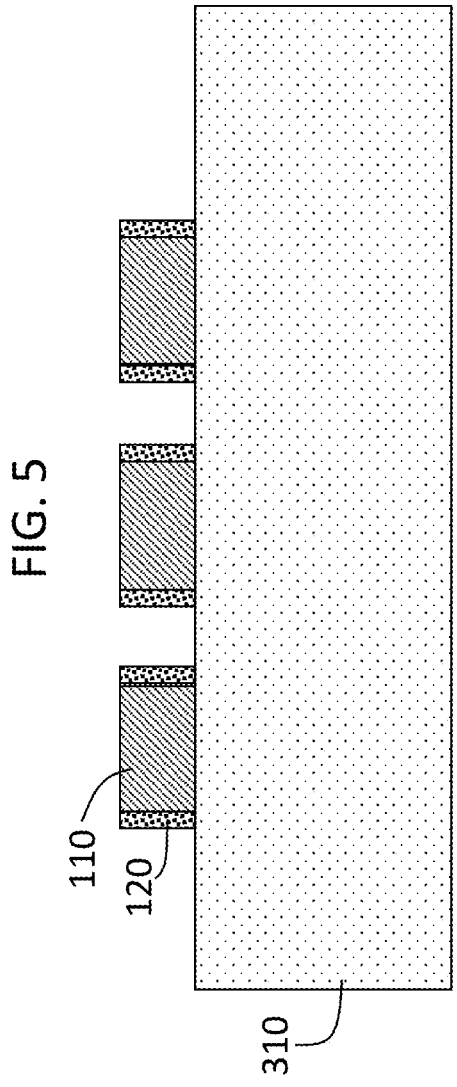

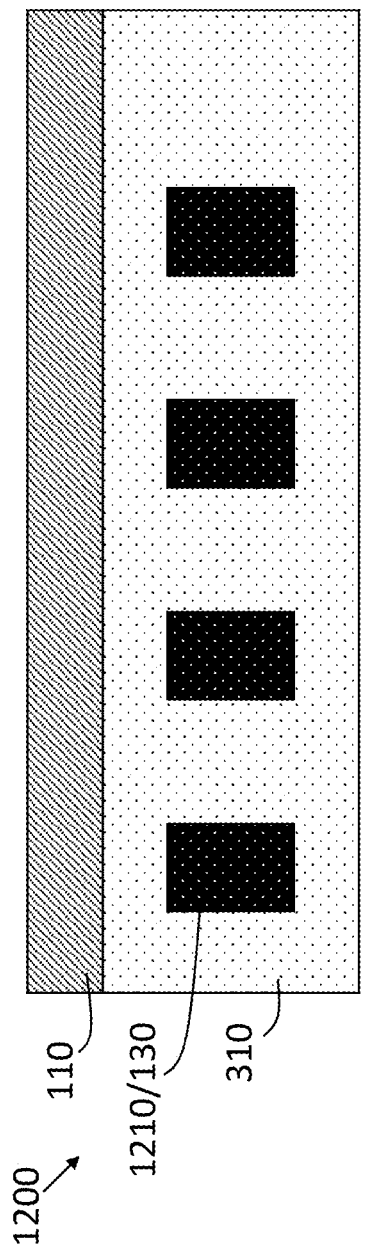
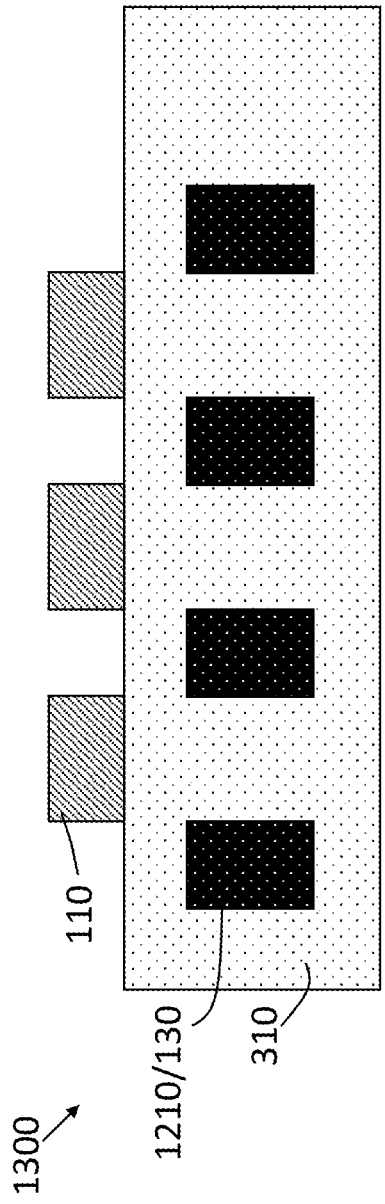

FABRICATION OF PHASE CHANGE MEMORY CELL IN INTEGRATED CIRCUIT

BACKGROUND

The present invention relates to integrated circuit formation, and more specifically, to the fabrication of a phase change memory (PCM) cell in an integrated circuit (i.e., chip).

Memory devices that are based on PCM materials take advantage of the resistivity contrast between PCM materials in the amorphous and crystalline phases. Generally, the application of a current that heats the active region of the PCM material to its melting temperature and then quickly cools it will result in the amorphous (i.e., high resistivity) phase, and the application of a current that heats the active region but results in a longer cooling period will result in the crystalline (i.e., low resistivity) phase. The application of a small voltage facilitates sensing of the resulting current as a way to read the state of the PCM element. Typically, PCM cells are formed within vias that connect one metal layer of an integrated circuit to another.

SUMMARY

Embodiments of the present invention are directed to a phase change memory (PCM) cell in an integrated circuit and a method of fabricating the PCM cell. The method includes depositing a layer of PCM material on a surface of a dielectric, patterning the layer of PCM material into a plurality of PCM blocks that are separated from each other, and forming heater material on both sidewalls of each of the plurality of the PCM blocks to form a plurality of PCM cells. Each of the plurality of the PCM blocks in combination with the heater material on both the sidewalls represents a PCM cell. The method also includes depositing an additional layer of the dielectric above and between the plurality of the PCM cells, and forming trenches in the dielectric. The forming the trenches includes forming a trench in contact with each side of each of the plurality of the PCM cells. Metal is deposited in each of the trenches such that current flow in the metal in contact with one of the plurality of PCM cells heats the heater material of the one of the plurality of PCM cells.

BRIEF DESCRIPTION OF THE DRAWINGS

The examples described throughout the present document will be better understood with reference to the following drawings and description. The components in the figures are not necessarily to scale. Moreover, in the figures, like-referenced numerals designate corresponding parts throughout the different views.

FIG. 1 shows a portion of an integrated circuit that includes a phase change memory (PCM) cell at a metal level according to an exemplary embodiment of the invention;

FIG. 2 shows a portion of an integrated circuit that includes a PCM cell between vias according to an exemplary embodiment of the invention;

FIGS. 3-11 illustrate aspects of the fabrication of a phase change memory (PCM) cell at the metal level, as shown in FIG. 1, according to one or more embodiments of the invention, in which:

FIG. 3 shows the deposition of PCM material on a dielectric;

FIG. 4 shows the result of patterning the PCM material;

FIG. 5 shows an intermediate structure that results from conformal deposition of heater material on the PCM material and the dielectric surface;

FIG. 6 shows the result of etching the heater material;

FIG. 7 shows the intermediate structure resulting from deposition of additional dielectric;

FIG. 8 shows trenches formed in the dielectric;

FIG. 9 shows the intermediate structure of FIG. 8 with a liner deposited conformally in the trenches;

FIG. 10 shows the result of depositing metal in the tranches to form wires adjacent to the PCM cell, as well as a via;

FIG. 11 shows the result of depositing a capping layer on the intermediate structure shown in FIG. 10;

FIG. 12-19 illustrate aspects of the fabrication of a phase change memory (PCM) cell between vias, as shown in FIG. 2, according to one or more embodiments of the invention, in which:

FIG. 12 shows PCM material deposited on a dielectric with lower-level metal wires formed within;

FIG. 13 shows an intermediate structure resulting from patterning of the PCM material on the dielectric;

FIG. 14 shows the result of conformally depositing a heater material on the PCM material and the dielectric;

FIG. 15 shows the intermediate structure that results from etching the heater material;

FIG. 16 shows the result of depositing additional dielectric on the intermediate structure shown in FIG. 15;

FIG. 17 shows an intermediate structure with trenches formed in the dielectric material;

FIG. 18 shows the result of depositing metal in the trenches to form metal lines and vias, which are adjacent to the PCM cells, above the lower-level metal wires and higher-level metal wires on the vias; and FIG. 19 shows the result of depositing a capping layer on the intermediate structure shown in FIG. 18.

DETAILED DESCRIPTION

Figure 7:
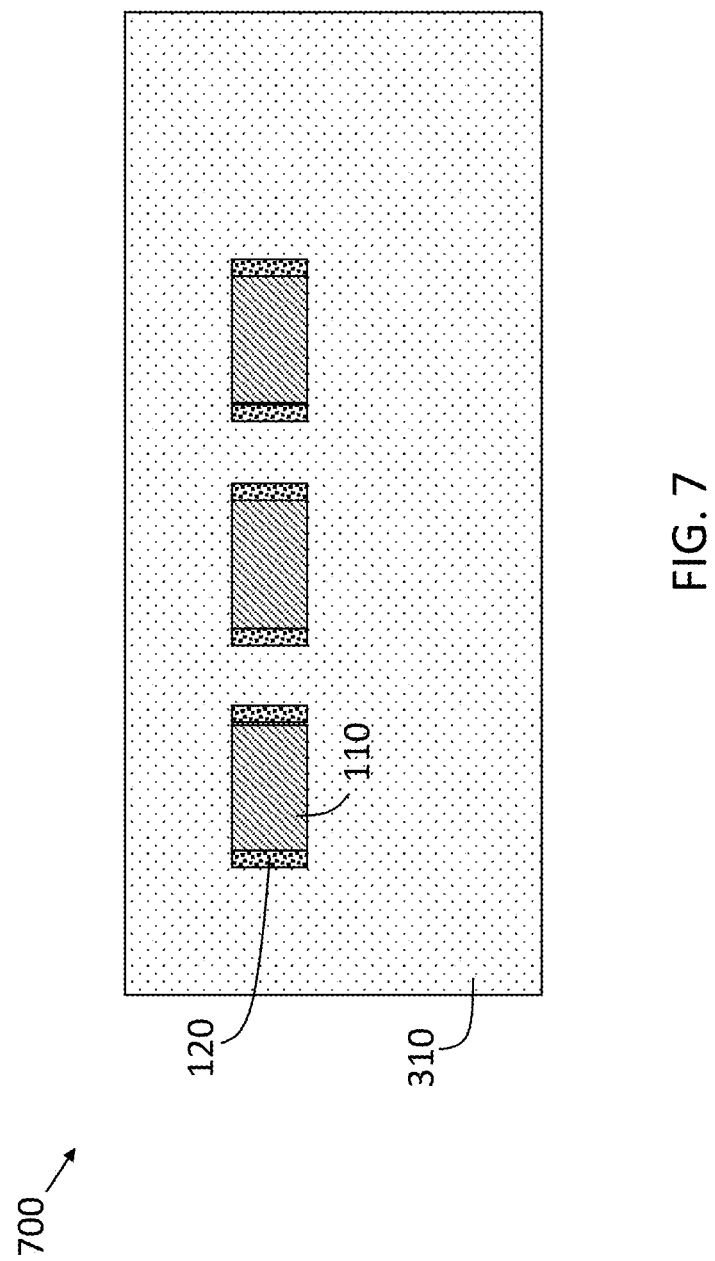

As previously noted, memory devices of integrated circuits can include PCM elements that are based on PCM materials. Typically, PCM cells are formed within the via (i.e., the interconnect between metal levels of the integrated circuit). These include PCM cells referred to as mushroom or bridge cells, for example. However, the integration and manufacture of such PCM cells is challenging. For example, vias must be formed at different heights depending on the connections needed for the PCM cells. In addition, due to the high current requirement, the PCM cells must generally be inserted at metal or via levels with relaxed pitches (i.e., spacing between PCM cells) such that higher density memory arrays are difficult to achieve. Embodiments of the methods and devices detailed herein relate to a structure for the PCM cells that facilitates insertion of the PCM cells between vias or at the metal levels with tight pitches. The PCM cell structure according to embodiments of the invention facilitates higher density memory devices than the conventional within-via arrangement.

FIG. 1 is a block diagram of aspects of an integrated circuit 100 that include a memory device according to one or more embodiments of the invention. Two metal levels 130 Mx and Mx+1 are shown with a via 140 V interconnecting them. The PCM cell 105 according to the exemplary embodiment shown in FIG. 1 is at the metal level 130 Mx. The PCM cell 105 is further discussed with reference to FIG. 2. The metal levels 130 and the via 140 can be comprised of copper (Cu), aluminum (Al), ruthenium (Ru), cobalt (Co), or tungsten (W), for example. FIGS. 3-11 detail the processes used to fabricate the memory device according to the exemplary embodiment shown in FIG. 1.

FIG. 2 is a block diagram of aspects of an integrated circuit 200 that include a memory device according to one or more embodiments of the invention. Two metal levels 130 Mx and Mx+1 are shown interconnected by vias 140 Vy and Vy+1. A PCM cell 105 is shown between the vias 140 Vy and Vy+1 according to the exemplary embodiment of the invention. The PCM cell 105 includes PCM material 110 and heater material 120 on either side of the PCM material 110. The PCM material 110 can be germanium-antimony-tellurium (GST), for example. The heater material 120 can be tantalum nitride (TaN), for example. FIGS. 12-19 detail the processes used to fabricate the memory device according to the exemplary embodiment shown in FIG. 2.

FIGS. 3-11 detail processes used to fabricate a PCM cell 105 in an integrated circuit according to one or more embodiments of the invention. The embodiments discussed with reference to FIGS. 3-11 pertain to the PCM cell 105 being formed at a metal level 130, as shown in FIG. 1. FIG. 3 shows an intermediate structure 300 in the formation of a PCM cell 105 according to an exemplary embodiment of the invention. Although not detailed, one or more metal levels 130 can be formed below the intermediate structure 300 shown in FIG. 3. The intermediate structure 300 results from the deposition of PCM material 110 on a dielectric 310. The dielectric 310 may be any low K dielectric material such as an oxide or nitride, for example. FIG. 4 shows an intermediate structure 400 that results from patterning the PCM material 110 that is deposited on the dielectric 310.

FIG. 5 shows an intermediate structure 500 in the formation of the PCM cell 105. The intermediate structure 500 results from conformally depositing heater material 120 on the patterned PCM material 110 and dielectric 310 of the intermediate structure 400 shown in FIG. 4. As previously noted, the heater material 120 can be TaN. FIG. 6 shows the intermediate structure 600 that results from etching the heater material 120. An anisotropic etch can be performed, for example, to etch away all the heater material 120 except at the sidewalls of the PCM material 110. FIG. 7 shows the intermediate structure 700 that results from an optional deposition of additional dielectric 310 on the intermediate structure 600 following the etch of the heater material 120.

Figure 8:
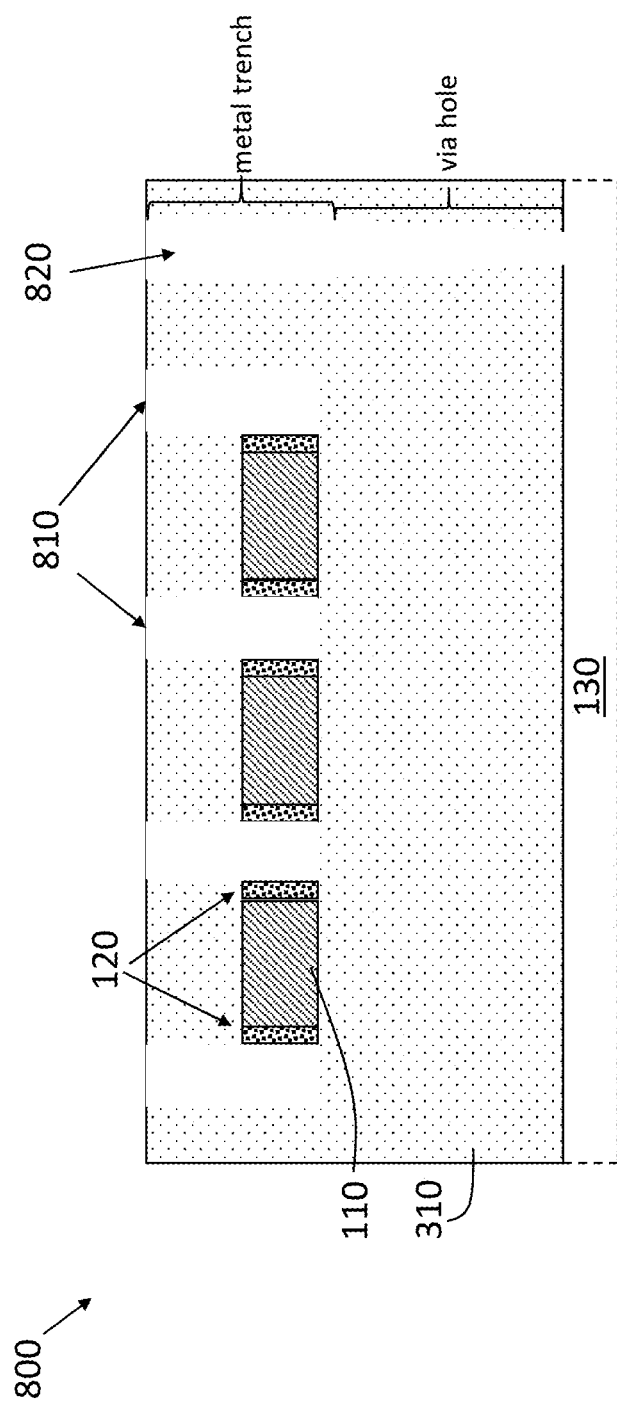
Figure 9:
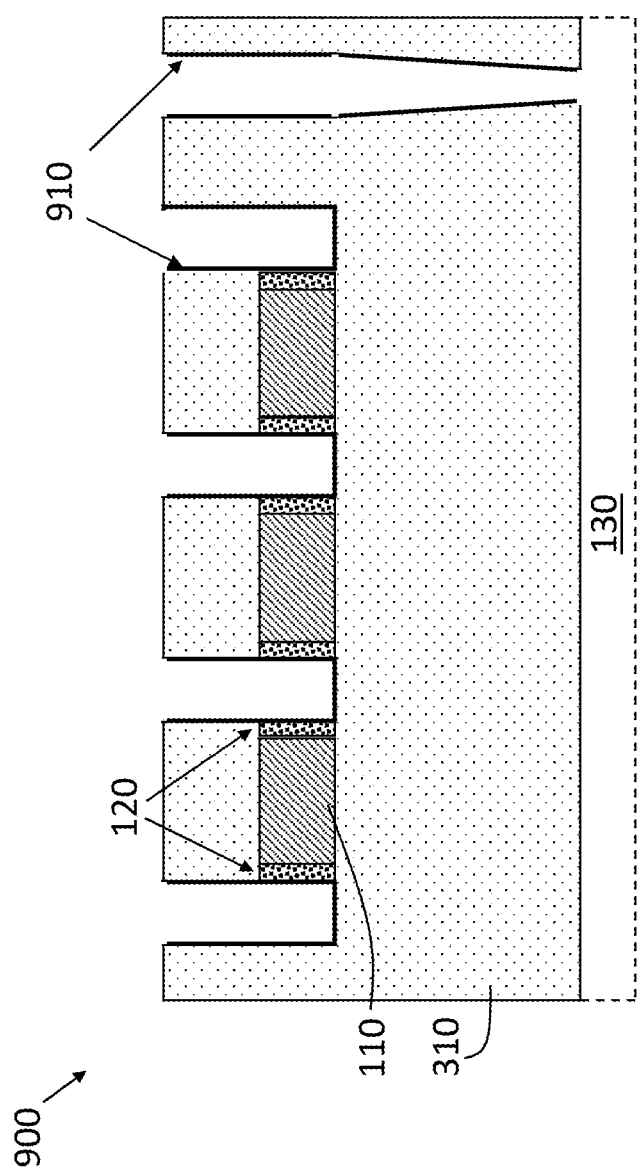
Figure 10:
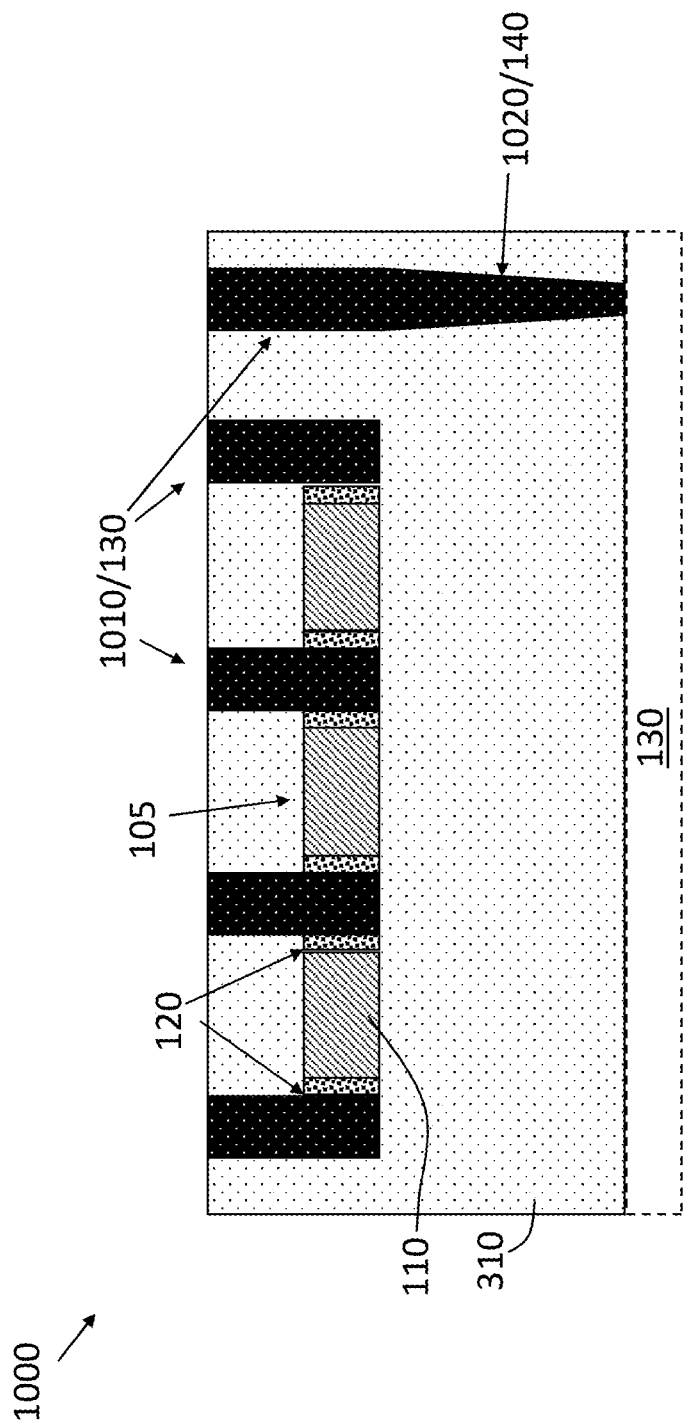

FIG. 8 shows the intermediate structure 800 that results from further processing of the intermediate structure 700. Specifically, trenches 810 and 820 are etched in the dielectric 310, as shown. The trench 820 can be formed as part of a dual damascene process to form a metal line and a via 140 in a single step. As such, the trench 820 includes a via hole portion and a metal trench portion, as indicated. In alternate embodiments, a single damascene process can be used. Because the exemplary embodiment shown in FIG. 8 includes the trench 820 for an interconnecting via 140 (FIG. 10) to the level below, a metal level 130 is shown below the dielectric 310. The trenches 810 are used to form wires for the metal level 130 above the dielectric 310, as shown in FIG. 10. FIG. 9 shows the intermediate structure 900 that results from conformal deposition of a liner 910 in the trenches 810, 820. The material of the liner 910 can be tantalum (Ta), tantalum nitride (TaN), cobalt (Co), ruthenium (Ru), bilayers of TaN and Ta, bilayers of TaN and Co, or bilayers of TaN and Ru.

FIG. 10 shows an intermediate structure 1000 that results from filling the trenches 810, 820. As shown, the trenches 810 are filled with wire metal 1010 that forms the metal level 130 at which the PCM cells 105 are formed. The trench 820 is filled with wire metal 1010 in the metal trench portion to form a metal level 130 and is filled with via metal 1020 in the via hole portion to form via 140. Although labeled differently for explanatory purposes, the wire metal 1010 and the via metal 1020 can be the same and may be, for example, Cu. Deposition of the wire metal 1010 can be followed by a chemical mechanical planarization (CMP) process.

Figure 11:
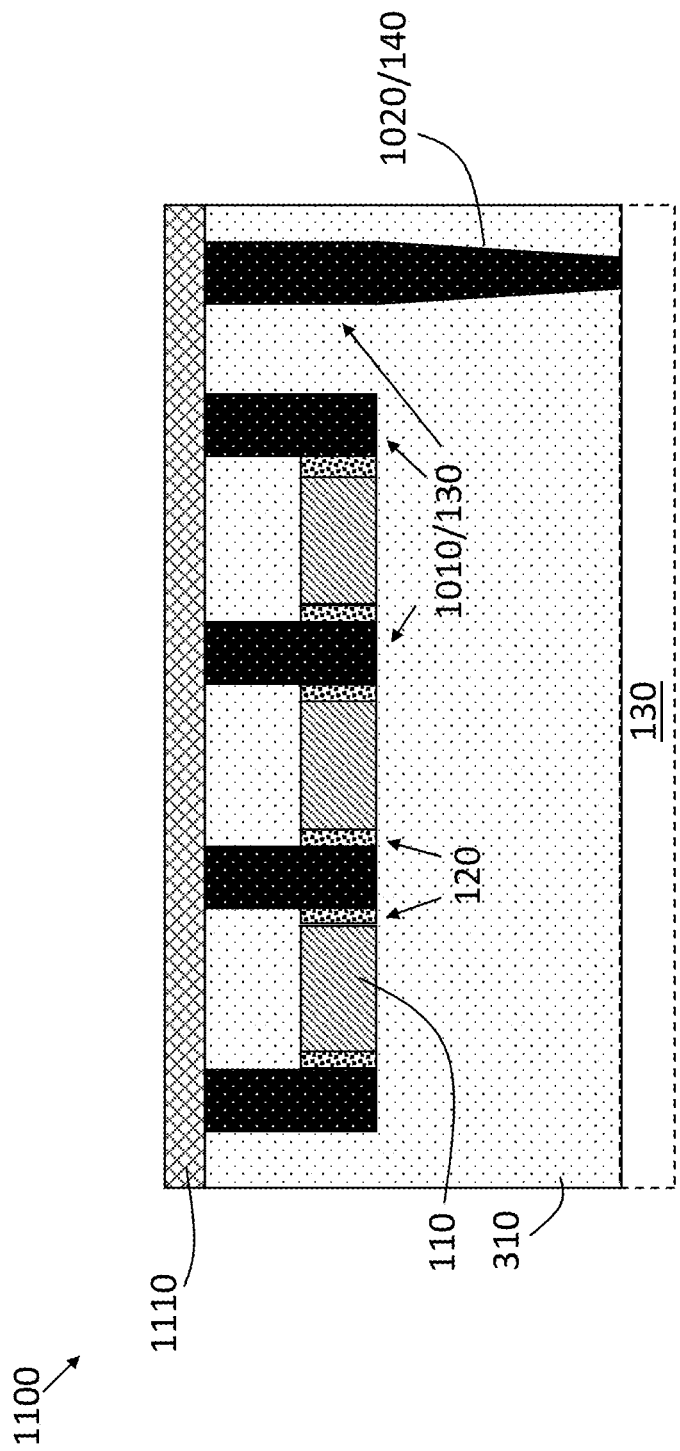

FIG. 11 shows an intermediate structure 1100 that results from the formation of a capping layer 1110 above the intermediate structure 1000. The capping layer 1110 is an insulator such as, for example, silicon nitride (SiN). The metal 1010 adjacent to the heater material 120 supplies current to heat the heater material 120 and affects change in the PCM material 110. The length of the metal 1010 must take into account the Blech effect such that a minimum length to carry sufficient current is achieved without risking electromigration failure.

FIGS. 12-19 detail processes used to fabricate a PCM cell 105 in an integrated circuit according to one or more embodiments of the invention. The embodiments discussed with reference to FIGS. 12-19 pertain to the PCM cell 105 being formed between vias 140, as shown in FIG. 2. FIG. 12 shows an intermediate structure 1200 in the formation of a PCM cell 105 according to an exemplary embodiment of the invention. The intermediate structure 1200 results from the deposition of dielectric 310 to cover wire metal 1210 that represents a metal level 130. Additional metal levels 130 may be below the one shown in FIG. 12. PCM material 110 is deposited on the dielectric 310. FIG. 13 shows an intermediate structure 1300 that results from patterning the PCM material 110 that is deposited on the dielectric 310.

Figure 14:
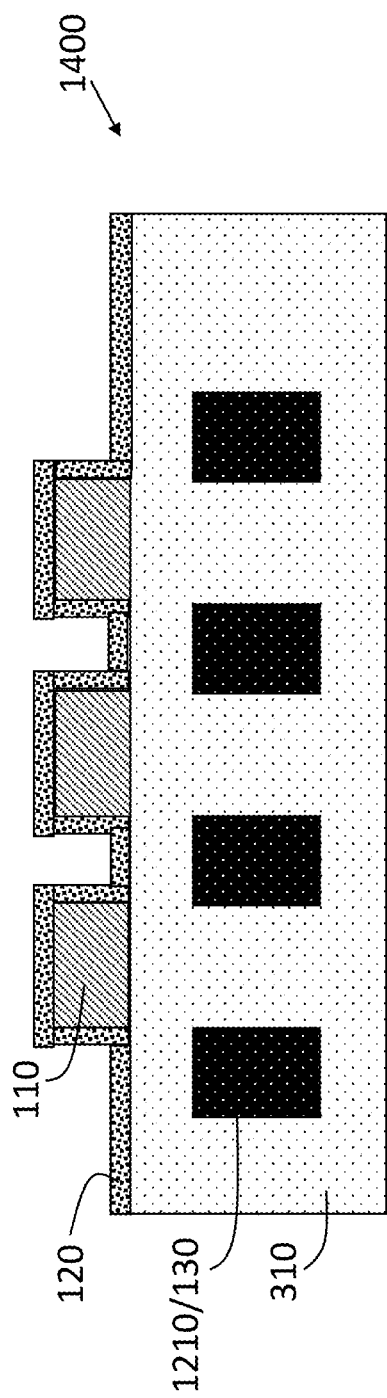
Figure 15:
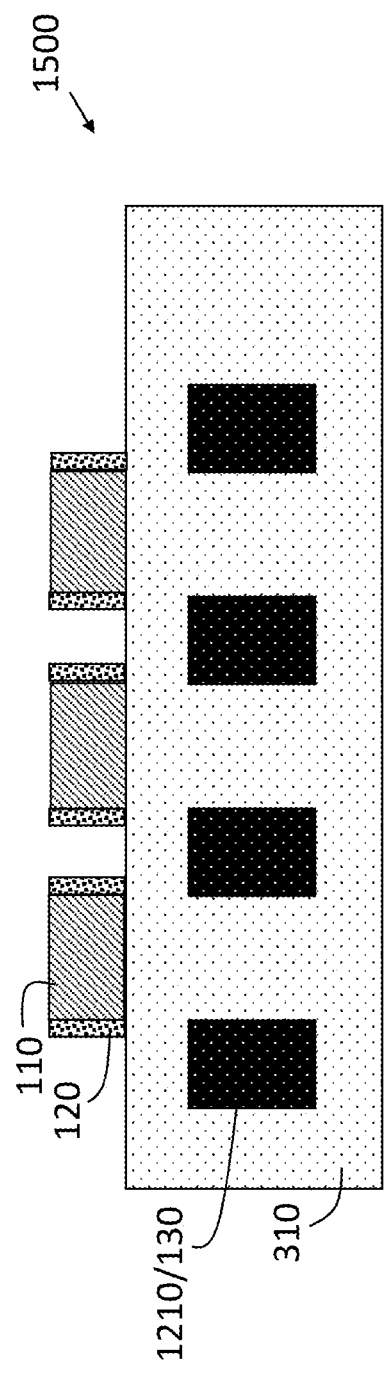
Figure 16:
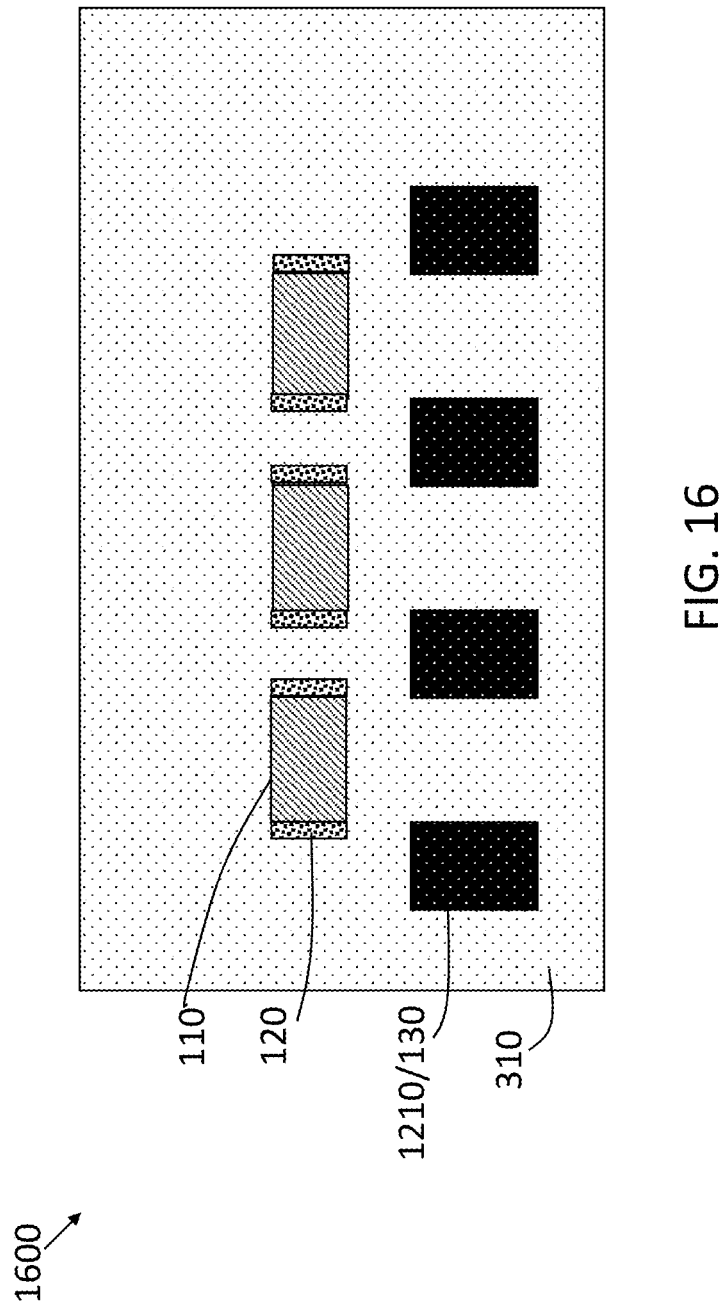

FIG. 14 shows an intermediate structure 1400 resulting from conformal deposition of heater material 120 on the surface of the dielectric 310 and on the surface and sidewalls of the patterned PCM material 110. FIG. 15 shows the intermediate structure 1500 that results from etching the heater material 120 from horizontal surfaces. An anisotropic etch can be performed, as discussed with reference to FIG. 6. Following the etch of the heater material 120, additional dielectric 310 is deposited to result in the intermediate structure 1600 shown in FIG. 16.

Figure 17:
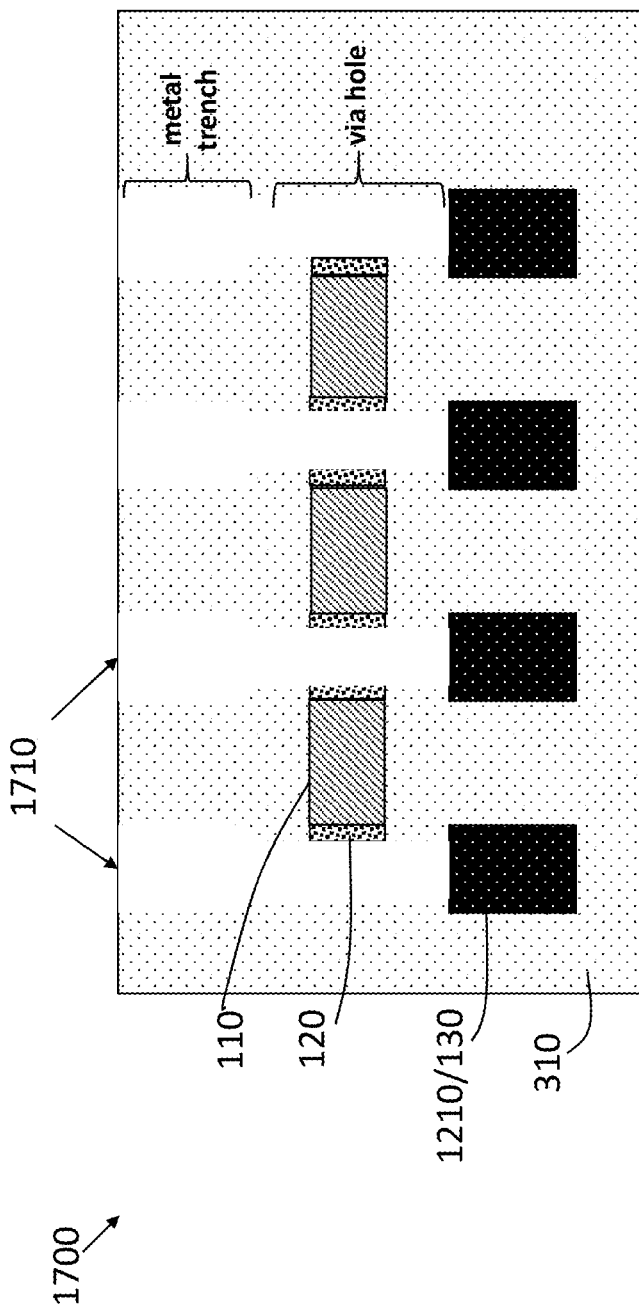
Figure 18:
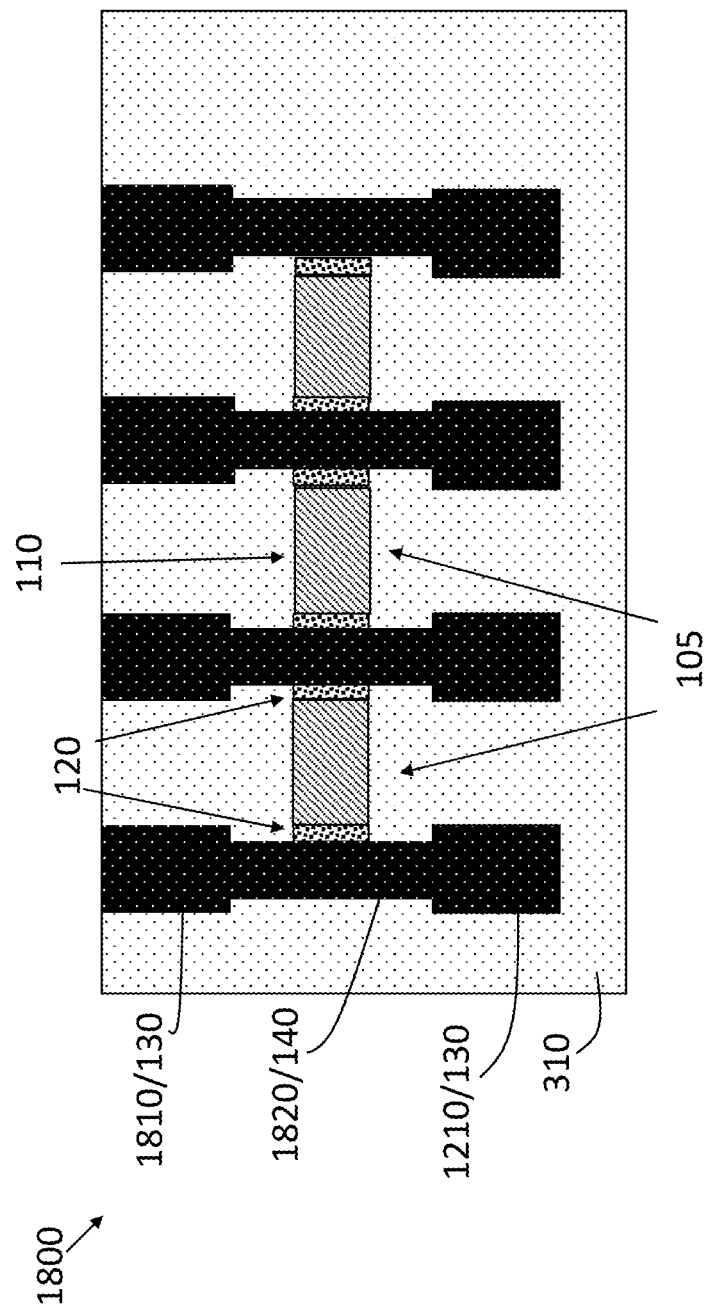
Figure 19:
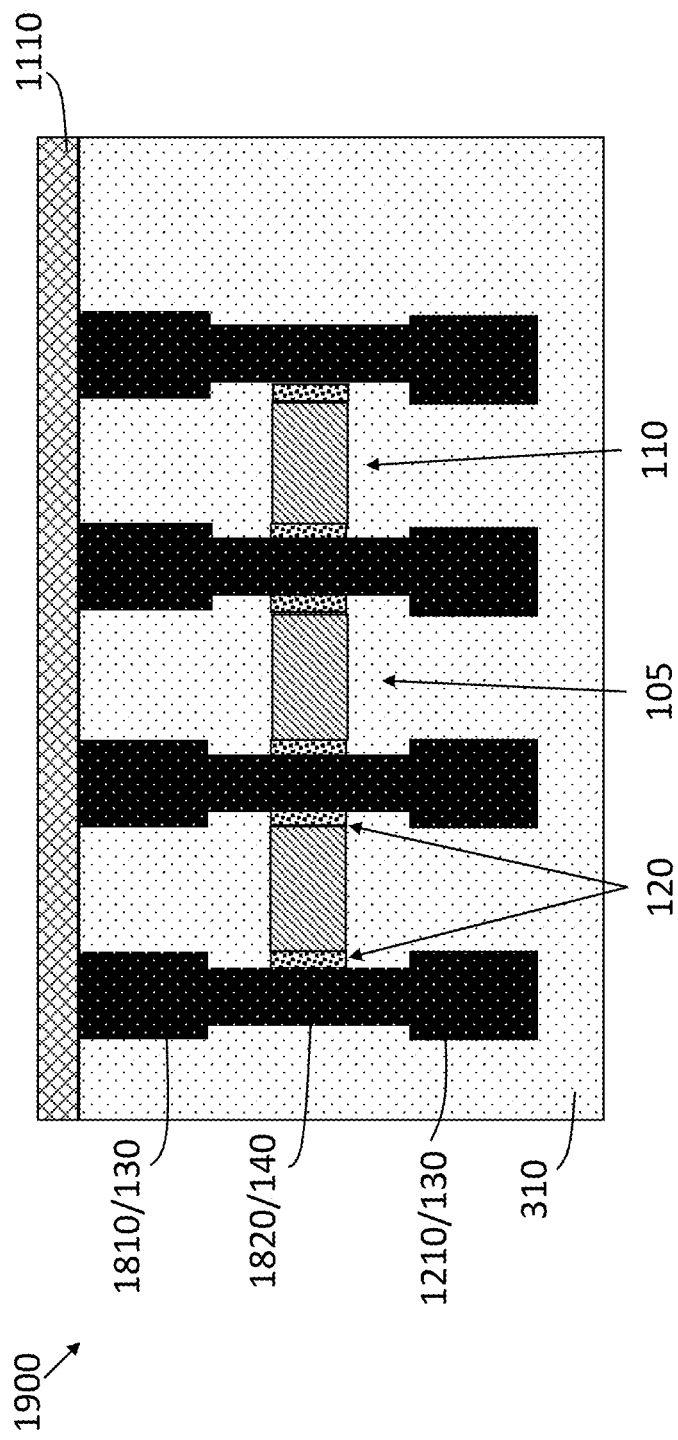

FIG. 17 shows an intermediate structure 1700 used in the formation of PCM cells 105 according to an exemplary embodiment of the invention that involves forming the PCM cells 105 between vias 140. As shown, trenches 1710 are formed in the dielectric 310 of the intermediate structure 1600, shown in FIG. 16, to result in the intermediate structure 1700. Each of the trenches 1710 is made up of a via hole and metal trench, as indicated. FIG. 18 shows the intermediate structure 1800 that results from filling the trenches 1710 with metal 1820 and wire metal 1810. As shown in FIG. 9, the trenches 1710 are conformally filed with a liner first. Although labeled differently for explanatory purposes, the wire metal 1210 that forms the lower metal level 130, the via metal 1820 that forms the vias 140, and the wire metal 1810 that forms the next metal level 130 can all be the same material (e.g., Cu). Forming a capping layer 1110 results in the intermediate structure 1900 shown in FIG. 19. As FIGS. 18 and 19 indicate, the PCM cells 105 are formed between vias 140 such that the via supplies current to the heater material 120 of each PCM cell 105. The width of the heater material 120 on either side of a PCM cell 105 can be on the order of 6 nanometers (nm) while the width of a via 140 can be on the order of 20 nm.

The methods and resulting structures described herein can be used in the fabrication of IC chips. The resulting IC chips can be distributed by the fabricator in raw wafer form (that is, as a single wafer that has multiple unpackaged chips), as a bare die, or in a packaged form. In the latter case, the chip is mounted in a single chip package (such as a plastic carrier, with leads that are affixed to a motherboard or other higher level carrier) or in a multichip package (such as a ceramic carrier that has either or both surface interconnections or buried interconnections). In any case, the chip is then integrated with other chips, discrete circuit elements, and/or other signal processing devices as part of either (a) an intermediate product, such as a motherboard, or (b) an end product. The end product can be any product that includes IC chips, ranging from toys and other low-end applications to advanced computer products having a display, a keyboard or other input device, and a central processor.

Various embodiments of the present invention are described herein with reference to the related drawings. Alternative embodiments can be devised without departing from the scope of this invention. Although various connections and positional relationships (e.g., over, below, adjacent, etc.) are set forth between elements in the detailed description and in the drawings, persons skilled in the art will recognize that many of the positional relationships described herein are orientation-independent when the described functionality is maintained even though the orientation is changed. These connections and/or positional relationships, unless specified otherwise, can be direct or indirect, and the present invention is not intended to be limiting in this respect. Similarly, the term "coupled" and variations thereof describe having a communications path between two elements and does not imply a direct connection between the elements with no intervening elements/connections between them. All of these variations are considered a part of the specification. Accordingly, a coupling of entities can refer to either a direct or an indirect coupling, and a positional relationship between entities can be a direct or indirect positional relationship. As an example of an indirect positional relationship, references in the present description to forming layer "A" over layer "B" include situations in which one or more intermediate layers (e.g., layer "C") is between layer "A" and layer "B" as long as the relevant characteristics and functionalities of layer "A" and layer "B" are not substantially changed by the intermediate layer(s).

The following definitions and abbreviations are to be used for the interpretation of the claims and the specification. As used herein, the terms "comprises," "comprising," "includes," "including," "has," "having," "contains" or "containing," or any other variation thereof, are intended to cover a non-exclusive inclusion. For example, a composition, a mixture, process, method, article, or apparatus that comprises a list of elements is not necessarily limited to only those elements but can include other elements not expressly listed or inherent to such composition, mixture, process, method, article, or apparatus.

Additionally, the term "exemplary" is used herein to mean "serving as an example, instance or illustration." Any embodiment or design described herein as "exemplary" is not necessarily to be construed as preferred or advantageous over other embodiments or designs. The terms "at least one" and "one or more" are understood to include any integer number greater than or equal to one, i.e. one, two, three, four, etc. The terms "a plurality" are understood to include any integer number greater than or equal to two, i.e. two, three, four, five, etc. The term "connection" can include an indirect "connection" and a direct "connection."

References in the specification to "one embodiment," "an embodiment," "an example embodiment," etc., indicate that the embodiment described can include a particular feature, structure, or characteristic, but every embodiment may or may not include the particular feature, structure, or characteristic. Moreover, such phrases are not necessarily referring to the same embodiment. Further, when a particular feature, structure, or characteristic is described in connection with an embodiment, it is submitted that it is within the knowledge of one skilled in the art to affect such feature, structure, or characteristic in connection with other embodiments whether or not explicitly described.

For purposes of the description hereinafter, the terms "upper," "lower," "right," "left," "vertical," "horizontal," "top," "bottom," and derivatives thereof shall relate to the described structures and methods, as oriented in the drawing figures. The terms "overlying," "atop," "on top," "positioned on" or "positioned atop" mean that a first element, such as a first structure, is present on a second element, such as a second structure, wherein intervening elements such as an interface structure can be present between the first element and the second element. The term "direct contact" means that a first element, such as a first structure, and a second element, such as a second structure, are connected without any intermediary conducting, insulating or semiconductor layers at the interface of the two elements.

Spatially relative terms, e.g., "beneath," "below," "lower," "above," "upper," and the like, can be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the term "below" can encompass both an orientation of above and below. The device can be otherwise oriented (rotated 90 degrees or at other orientations) and the spatially relative descriptors used herein interpreted accordingly.

The terms "about," "substantially," "approximately," and variations thereof, are intended to include the degree of error associated with measurement of the particular quantity based upon the equipment available at the time of filing the application. For example, "about" can include a range of 8% or 5%, or 2% of a given value.

The phrase "selective to," such as, for example, "a first element selective to a second element," means that the first element can be etched and the second element can act as an etch stop.

The term "conformal" (e.g., a conformal layer) means that the thickness of the layer is substantially the same on all surfaces, or that the thickness variation is less than 15% of the nominal thickness of the layer.

As previously noted herein, for the sake of brevity, conventional techniques related to semiconductor device and IC fabrication may or may not be described in detail herein. By way of background, however, a more general description of the semiconductor device fabrication processes that can be utilized in implementing one or more embodiments of the present invention will now be provided. Although specific fabrication operations used in implementing one or more embodiments of the present invention can be individually known, the described combination of operations and/or resulting structures of the present invention are unique. Thus, the unique combination of the operations described in connection with the fabrication of a semiconductor device according to the present invention utilize a variety of individually known physical and chemical processes performed on a semiconductor (e.g., silicon) substrate, some of which are described in the immediately following paragraphs.

In general, the various processes used to form a microchip that will be packaged into an IC fall into four general categories, namely, film deposition, removal/etching, semiconductor doping and patterning/lithography. Deposition is any process that grows, coats, or otherwise transfers a material onto the wafer. Available technologies include physical vapor deposition (PVD), chemical vapor deposition (CVD), electrochemical deposition (ECD), molecular beam epitaxy (MBE) and more recently, atomic layer deposition (ALD) among others. Removal/etching is any process that removes material from the wafer. Examples include etch processes (either wet or dry), chemical-mechanical planarization (CMP), and the like. Reactive ion etching (RIE), for example, is a type of dry etching that uses chemically reactive plasma to remove a material, such as a masked pattern of semiconductor material, by exposing the material to a bombardment of ions that dislodge portions of the material from the exposed surface. The plasma is typically generated under low pressure (vacuum) by an electromagnetic field. Semiconductor doping is the modification of electrical properties by doping, for example, transistor sources and drains, generally by diffusion and/or by ion implantation. These doping processes are followed by furnace annealing or by rapid thermal annealing (RTA). Annealing serves to activate the implanted dopants. Films of both conductors (e.g., poly-silicon, aluminum, copper, etc.) and insulators (e.g., various forms of silicon dioxide, silicon nitride, etc.) are used to connect and isolate transistors and their components. Selective doping of various regions of the semiconductor substrate allows the conductivity of the substrate to be changed with the application of voltage. By creating structures of these various components, millions of transistors can be built and wired together to form the complex circuitry of a modern microelectronic device. Semiconductor lithography is the formation of three-dimensional relief images or patterns on the semiconductor substrate for subsequent transfer of the pattern to the substrate. In semiconductor lithography, the patterns are formed by a light sensitive polymer called a photo-resist. To build the complex structures that make up a transistor and the many wires that connect the millions of transistors of a circuit, lithography and etch pattern transfer steps are repeated multiple times. Each pattern being printed on the wafer is aligned to the previously formed patterns and slowly the conductors, insulators and selectively doped regions are built up to form the final device.

The flowchart and block diagrams in the Figures illustrate possible implementations of fabrication and/or operation methods according to various embodiments of the present invention. Various functions/operations of the method are represented in the flow diagram by blocks. In some alternative implementations, the functions noted in the blocks can occur out of the order noted in the Figures. For example, two blocks shown in succession can, in fact, be executed substantially concurrently, or the blocks can sometimes be executed in the reverse order, depending upon the functionality involved.

The descriptions of the various embodiments of the present invention have been presented for purposes of illustration, but are not intended to be exhaustive or limited to the embodiments described. Many modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments described herein.

What is claimed is:

1. A method of performing fabrication of a phase change memory (PCM) cell in an integrated circuit, the method comprising:
depositing a layer of PCM material on a surface of a dielectric;
patterning the layer of PCM material into a plurality of PCM blocks that are separated from each other;
forming heater material on both sidewalls of each of the plurality of the PCM blocks to form a plurality of PCM cells, wherein each of the plurality of the PCM blocks in combination with the heater material on both the sidewalls represents a PCM cell;
depositing an additional layer of the dielectric above and between the plurality of the PCM cells;
forming trenches in the dielectric, wherein the forming the trenches includes forming a trench in contact with each side of each of the plurality of the PCM cells; and
depositing metal in each of the trenches such that current flow in the metal in contact with one of the plurality of PCM cells heats the heater material of the one of the plurality of PCM cells.

2. The method according to claim 1, further comprising conformally depositing a layer of the heater material on the plurality of the PCM blocks and the dielectric following the patterning of the layer of the PCM material.

3. The method according to claim 2, wherein the forming the heater material on both of the sidewalls of each of the plurality of the PCM blocks includes etching the heater material from horizontal surfaces of the PCM blocks and the dielectric.

4. The method according to claim 1, further comprising forming first metal wires within the dielectric prior to the depositing the layer of the PCM material on the surface of the dielectric.

5. The method according to claim 4, wherein the forming the trenches in the dielectric includes forming each of the trenches from the surface of the dielectric to one of the first metal wires.

6. The method according to claim 5, wherein each of the trenches includes a via portion directly above the corresponding one of the first metal wires and a second metal wire portion above the via portion.

7. The method according to claim 6, wherein the via portion is in contact with one of the plurality of the PCM cells.

8. The method according to claim 1, wherein the forming the trenches in the dielectric includes forming metal wire portions such that each metal wire portion is in contact with one of the plurality of the PCM cells.

9. The method according to claim 8, wherein the forming the trenches in the dielectric additionally includes forming a via through the dielectric.

10. The method according to claim 1, further comprising forming a capping layer.

\* \* \* \* \*